(12) United States Patent
Ishihara

(10) Patent No.: US 7,067,920 B2
(45) Date of Patent: Jun. 27, 2006

(54) SEMICONDUCTOR DEVICE AND METHOD OF FABRICATING THE SAME

(75) Inventor: Yoshitaka Ishihara, Tokyo (JP)

(73) Assignee: Elpida Memory, Inc. (JP)

( * ) Notice: Subject to any disclaimer, the term of this patent is extended or adjusted under 35 U.S.C. 154(b) by 291 days.

(21) Appl. No.: 10/346,448

(22) Filed: Jan. 17, 2003

(65) Prior Publication Data

US 2003/0137054 A1 Jul. 24, 2003

(30) Foreign Application Priority Data

Jan. 22, 2002 (JP) .......................... 2002-012423

(51) Int. Cl.
- *H01L 23/48* (2006.01)
- *H01L 23/52* (2006.01)
- *H01L 29/40* (2006.01)

(52) U.S. Cl. ............... 257/758; 257/759; 257/763; 257/764

(58) Field of Classification Search ........... 257/758, 257/765, 763, 764, 771, 759, 750, 751, 760, 257/762, 296, 306, 307, 308, 906, 907, 908; 438/622, 638, 666, 627, 688, 253, 254, 396, 438/397, 398

See application file for complete search history.

(56) References Cited

U.S. PATENT DOCUMENTS 5,990,001 A * 11/1999 Oda .......................... 438/633
6,326,315 B1 * 12/2001 Uchiyama et al.

FOREIGN PATENT DOCUMENTS

| JP | 05-326511 | 12/1993 |
|---|---|---|
| JP | 11-087498 | 3/1999 |
| JP | 11-354519 | 12/1999 |
| JP | 2000-228446 | 8/2000 |

* cited by examiner

*Primary Examiner*—Hoai Pham
*Assistant Examiner*—DiLinh Nguyen
(74) *Attorney, Agent, or Firm*—Hayes Soloway P.C.

(57) ABSTRACT

A semiconductor device includes an upper wiring layer, a lower wiring layer, an electrically insulating layer sandwiched between the upper and lower wiring layers, a tungsten plug formed in a through-hole formed through the electrically insulating layer, for electrically connecting the upper and lower wiring layers to each other, a titanium film covering an inner surface of the through-hole and a surface of the electrically insulating layer therewith, a first titanium nitride film entirely covering the titanium film therewith, and a second titanium nitride film covering the first titanium nitride film and a surface of the tungsten plug therewith.

10 Claims, 17 Drawing Sheets

SEMICONDUCTOR DEVICE AND METHOD OF FABRICATING THE SAME

BACKGROUND OF THE INVENTION

1. Field of the Invention

The invention relates to a semiconductor device and a method of fabricating the same, and more particularly to a semiconductor device having a wiring structure which enhances a resistance to electromigration, and a method of fabricating the same.

2. Description of the Related Art

There have been suggested a lot of wiring structures for electrically connecting an upper wiring layer and a lower wiring layer to each other through a metal plug.

As a first example of a conventional wiring structure, the wiring structure suggested in Japanese Unexamined Patent Publication No. 5-326511 is illustrated in FIG. 1.

The illustrated wiring structure is comprised of a silicon substrate 51, a first electrically insulating film 52 composed of silicon dioxide and formed on the silicon substrate 51, a titanium film 53 formed on the first electrically insulating film 52, a first titanium nitride film 54 formed on the titanium film 53, a first aluminum-copper alloy film 55 formed as a lower wiring layer on the first titanium nitride film 54, a second titanium nitride film 56 formed on the first aluminum-copper alloy film 55, a second electrically insulating film 57 composed of silicon dioxide and formed on the second titanium nitride film 56, a third titanium nitride film 58 covering an inner surface of a through-hole 57a formed throughout the second electrically insulating film 57, and a surface of the second electrically insulating film 57 therewith, and acting as a barrier metal for a later mentioned tungsten plug 59, a tungsten plug 59 filled in the through-hole 57a, and a second aluminum-copper alloy film 60 formed as an upper wiring layer on both the tungsten plug 59 and the third titanium nitride film 58.

The wiring structure illustrated in FIG. 1 is fabricated as follows.

First, there are formed the first electrically insulating film 52, the titanium film 53, the first titanium nitride film 54, the first aluminum-copper alloy film 55, the second titanium nitride film 56 and the second electrically insulating film 57 in this order on the silicon substrate 51. Then, the through-hole 57a is formed throughout the second electrically insulating film 57 such that the through-hole 57a reaches the first aluminum-copper alloy film 55.

Then, the third titanium nitride film 58 is formed on an inner surface of the through-hole 57a and a surface of the second electrically insulating film 57 by DC magnetron sputtering, for instance. The third titanium nitride film 58 acts as a barrier metal for the tungsten plug 59.

Then, the through-hole 57a is filled with tungsten. Then, the tungsten is etched back until the third titanium nitride film 58 appears.

Thereafter, the second aluminum-copper alloy film 60 is formed as an upper wiring layer on both the tungsten plug 59 and the third titanium nitride film 58.

FIG. 2 illustrates a second example of a conventional wiring structure for electrically connecting upper and lower wiring layers to each other through a metal plug.

The illustrated wiring structure is comprised of a silicon substrate 61, a first electrically insulating film 62 composed of silicon dioxide and formed on the silicon substrate 61, a first titanium film 63 formed on the first electrically insulating film 62, a first titanium nitride film 64 formed on the first titanium film 63, a first aluminum-copper alloy film formed as a lower wiring layer on the first titanium nitride film 64, a second titanium nitride film 66 formed on the first aluminum-copper alloy film 65, a second electrically insulating film 67 composed of silicon dioxide and formed on the second titanium nitride film 66, a third titanium nitride film 68 covering an inner surface of a through-hole 67a formed throughout the second electrically insulating film 67, and a surface of the second electrically insulating film 67 therewith, and acting as a barrier metal for a later mentioned tungsten plug 69, a tungsten plug 69 filled in the through-hole 67a, a second titanium film 70 covering the tungsten plug 69 and the second electrically insulating film 67 therewith, a fourth titanium nitride film 71 formed on the second titanium film 70, and a second aluminum-copper alloy film 72 formed as an upper wiring layer on the fourth titanium nitride film 71.

The wiring structure illustrated in FIG. 2 is fabricated as follows.

First, there are formed the first electrically insulating film 62, the first titanium film 63, the first titanium nitride film 64, the first aluminum-copper alloy film 65, the second titanium nitride film 66 and the second electrically insulating film 67 in this order on the silicon substrate 61. Then, the through-hole 67a is formed throughout the second electrically insulating film 67 such that the through-hole 67a reaches the first aluminum-copper alloy film 65.

Then, the third titanium nitride film 68 is formed on an inner surface of the through-hole 67a and a surface of the second electrically insulating film 67 by DC magnetron sputtering, for instance. The third titanium nitride film 68 acts as a barrier metal for the tungsten plug 69.

Then, the through-hole 67a is filled with tungsten. Then, the third titanium nitride film 68 formed on the second electrically insulating film 67 is removed by chemical mechanical polishing (CMP) until the second electrically insulating film 67 appears.

Thereafter, there are formed the second titanium film 70, the fourth titanium nitride film 71 and the second aluminum-copper alloy film 72 in this order over the tungsten plug 69 and the second electrically insulating film 67.

As a third example of a conventional wiring structure, the wiring structure suggested in Japanese Unexamined Patent Publication No. 11-354519 is illustrated in FIG. 3.

The illustrated wiring structure is comprised of a silicon substrate 71, a first electrically insulating film 72 formed on the silicon substrate 71, a first titanium film 73 covering therewith an inner surface of a through-hole 72a formed throughout the first electrically insulating film 72, a first titanium nitride film 74 entirely covering the first titanium film 73 therewith, a first tungsten plug 75 buried in the through-hole 72a, a second electrically insulating film 76 formed on the first electrically insulating film 72, a second titanium film 77 formed on the first electrically insulating film 72, entirely covering the first tungsten plug 75 therewith, a second titanium nitride film 78 formed on the second titanium film 77, a first aluminum-copper alloy film 79 formed as a lower wiring layer on the second titanium nitride film 78, a third titanium film 80 formed on the first aluminum-copper alloy film 79, a third titanium nitride film 81 formed on the third titanium film 80, a fourth titanium film 82 entirely covering an inner surface of a through-hole 76a formed throughout the second electrically insulating film 76, a fourth titanium nitride film 83 entirely covering the fourth titanium film 82 therewith, a second tungsten plug 84 buried in the through-hole 76a, a fifth titanium film 85 formed on the second electrically insulating film 76, entirely covering the second tungsten plug 84 therewith, a fifth titanium nitride film 86 formed on the fifth titanium film 85, a second aluminum-copper alloy film 87 formed as an upper wiring layer on the fifth titanium nitride film 86, a sixth titanium film 88 formed on the second aluminum-copper alloy film 87, and a sixth titanium nitride film 89 formed on the sixth titanium film 88.

In the wiring structure, the first titanium film 73 and the first titanium nitride film 74 act as a barrier metal for the first tungsten plug 75, and the fourth titanium film 82 and the fourth titanium nitride film 83 act as a barrier metal for the second tungsten plug 84.

In the wiring structure illustrated in FIG. 1 as a first example of a conventional wiring structure, the aluminum-copper alloy film 60 is formed as an upper wiring layer on the third titanium nitride film 58. Titanium nitride has <111> orientation, and aluminum-copper alloy has <111> orientation.

However, if the aluminum-copper alloy film 60 having <111> orientation is formed on the second electrically insulating film 57 with the titanium nitride film 58 having <111> orientation which is closer to the orientation of aluminum-copper alloy, being sandwiched therebetween, <111> orientation of aluminum in the aluminum-copper alloy film 60 is weakened.

In addition, since the aluminum-copper alloy film 60 is formed directly on a surface of the tungsten plug 59 which became rough by the step of etching the tungsten plug 59 back, <111> orientation of the aluminum-copper alloy film 60 is unlikely to be aligned.

As set forth in Japanese Unexamined Patent Publication No. 5-326511, the aluminum-copper alloy film 60 may be formed after having etched the tungsten plug 59 back and having turned the third titanium nitride film 58 into an amorphous film, in which case, however, the aluminum-copper alloy film 60 could not have a sufficient resistance to electromigration.

As a result, the wiring structure illustrated in FIG. 1 is accompanied with a problem that the upper wiring layer formed as the aluminum-copper alloy film 60 has a small resistance to electromigration, and hence, there is much dispersion in an average lifetime of wirings.

In the wiring structure illustrated in FIG. 2 as a second example of a conventional wiring structure, the second titanium film 70 is sandwiched between the second electrically insulating film 67 composed of silicon dioxide and the fourth titanium nitride film 71.

Titanium has <002> orientation, titanium nitride has <111> orientation, and aluminum-copper alloy has <111> orientation. However, it is known that the aluminum-copper alloy film 72 having <111> orientation can be obtained by forming a titanium layer and a titanium nitride layer in a multi-layered structure.

Aluminum-copper alloy predominantly contains aluminum, and could have a high resistance to electromigration, if its orientation has a peak at Al<111>. Hence, the aluminum-copper alloy film 72 as an upper wiring layer can have a sufficient resistance to electromigration.

However, the wiring structure illustrated in FIG. 2 is accompanied with a problem that a process of fabricating the wiring structure has unavoidably complexity, because the third titanium nitride film 68 has to be removed by CMP, and it would be necessary to prepare a complex and expensive apparatus for carrying out such CMP, resulting in an increase in fabrication costs. In addition, the process of fabricating the wiring structure has to unavoidably carry out additional steps to form the second titanium film 70 and the fourth titanium nitride film 71.

The wiring structure illustrated in FIG. 3 as a third example of a conventional wiring structure has the same problems as those found in the wiring structure illustrated in FIG. 2 as a second example of a conventional wiring structure.

Japanese Unexamined Patent Publication No. 11-87498 has suggested a semiconductor device including a semiconductor substrate, an electrically insulating film formed on the semiconductor substrate, a wiring layer formed on the electrically insulating film, a silicon dioxide film covering upper and side surfaces of the wiring layer therewith, and a film having a low dielectric constant and covering an upper surface of the silicon dioxide film therewith. The silicon dioxide film has a first thickness on a side surface of the wiring layer, and a second thickness on an upper surface of the wiring layer, wherein the first thickness is greater than the second thickness.

Japanese Unexamined Patent Publication No. 2000-228446 has suggested a semiconductor device including a semiconductor substrate, a lower wiring layer formed on the semiconductor substrate, an interlayer insulating film formed on the lower wiring layer, a barrier metal film composed of refractory metal and buried at a bottom of a via-hole formed throughout the interlayer insulating film and reaching the lower wiring layer, an electrically conductive film formed on the barrier metal film, and an upper wiring layer formed on the interlayer insulating film and making electrical contact with the electrically conductive film. The upper wiring layer is comprised of a first titanium film, a titanium nitride film, a second titanium film, and an aluminum or aluminum-copper alloy film.

The above-mentioned problems remain unsolved even in the semiconductor devices suggested in the above-identified Publications.

SUMMARY OF THE INVENTION

In view of the above-mentioned problems in the conventional wiring structures in a semiconductor device, it is an object of the present invention to provide a semiconductor device which is capable of aligning orientation in an upper wiring layer without an increase in complexity in a process of fabricating the semiconductor device, to thereby enhance a resistance in the upper wiring layer to electromigration.

In one aspect of the present invention, there is provided a semiconductor device including (a) an upper wiring layer, (b) a lower wiring layer, (c) a plug electrically connecting the upper and lower wiring layers to each other, (d) a barrier metal for the plug, having a multi-layered structure comprised of a titanium film and a first titanium nitride film, and (e) a second titanium nitride film formed on both the plug and the first titanium nitride film.

It is preferable that the second titanium nitride film is formed on the plug which was formed by etching back a material of which the plug is composed of, in which case, the material is tungsten, for instance.

It is preferable that the second titanium nitride film has a thickness equal to or greater than 2.5 nm.

For instance, the upper wiring layer is composed of aluminum-copper alloy.

There is further provided a semiconductor device including (a) an upper wiring layer, (b) a lower wiring layer, (c) an electrically insulating layer sandwiched between the upper and lower wiring layers, (d) a plug formed in a through-hole formed throughout the electrically insulating layer, for electrically connecting the upper and lower wiring layers to each other, (e) a titanium film covering an inner surface of the through-hole and a surface of the electrically insulating layer therewith, (f) a first titanium nitride film entirely covering the titanium film therewith, and (g) a second titanium nitride film covering the first titanium nitride film and a surface of the plug therewith.

In another aspect of the present invention, there is provided a method of fabricating a semiconductor device, including the steps of (a) forming a lower wiring layer, (b) forming an electrically insulating layer on the lower wiring layer, (c) forming a through-hole through the electrically insulating layer such that the through-hole reaches the lower wiring layer, (d) covering an inner surface of the through-hole and a surface of the electrically insulating layer with a titanium film, (e) entirely covering the titanium film with a first titanium nitride film, (f) filling the through-hole with a metal, (g) etching the metal back until the first titanium nitride film appears, (h) forming a second titanium nitride film on both the metal and the first titanium nitride, and (i) forming an upper wiring layer on the second titanium nitride film.

It is preferable that the second titanium nitride is formed in the step (h) to have a thickness equal to or greater than 2.5 nm.

For instance, a layer composed of aluminum-copper alloy is formed in the step (i) as the upper wiring layer.

For instance, the through-hole is filled with tungsten in the step (f).

The advantages obtained by the aforementioned present invention will be described hereinbelow.

In the semiconductor device in accordance with the present invention, as a barrier metal for an upper wiring layer, the second titanium film, the third titanium nitride film and the fourth titanium nitride film are formed on the second electrically insulating film, and the fourth titanium nitride film is formed on the tungsten plug. This structure ensures that titanium has a peak of Ti<002> in orientation thereof, and titanium nitride has a peak of TiN<111> in orientation thereof. When an upper wiring layer is comprised of an aluminum-copper alloy film, the upper wiring layer is influenced by the orientation of titanium nitride, and thus, a peak strength of <111> orientation of the aluminum-copper alloy film is made greater.

In conventional wiring structures, a tungsten plug is formed by filling a through-hole formed throughout an electrically insulating film, with tungsten, and etching the tungsten back until a titanium nitride film formed on the electrically insulating film appears. The titanium nitride film has a surface having been roughened by etching the tungsten back. Accordingly, if an aluminum-copper alloy film constituting an upper wiring layer were formed directly on the thus roughened surface of the titanium nitride film, there would be caused a problem that the <111> orientation of the aluminum-copper alloy film is not aligned with one another. In order to solve this problem, there were carried out complex and high-cost steps of removing the titanium nitride film and the titanium film, and forming a titanium film and a titanium nitride film again, in the conventional wiring structures.

In the semiconductor device in accordance with the present invention, there is formed the fourth titanium nitride film covering the tungsten plug and the third titanium nitride film therewith, before an upper wiring layer is formed. The fourth titanium nitride film cancels influence caused by a rough surface of the third titanium nitride film, and hence, solves the problem that the <111> orientation of the upper wiring layer is unlikely to be aligned.

As mentioned above, the semiconductor device in accordance with the present invention makes it possible to omit steps of additionally forming a titanium film and a titanium nitride film, since the second titanium film 8 and the third titanium nitride film 9 are not etched back. Thus, only by carrying out a simple step of forming a titanium nitride film (specifically, the fourth titanium nitride film), it would be possible to obtain the upper wiring layer having enhanced <111> orientation, and thus, enhance a resistance of an aluminum-copper alloy film constituting the upper wiring layer, to electromigration.

The above and other objects and advantageous features of the present invention will be made apparent from the following description made with reference to the accompanying drawings, in which like reference characters designate the same or similar parts throughout the drawings.

Figure 13:
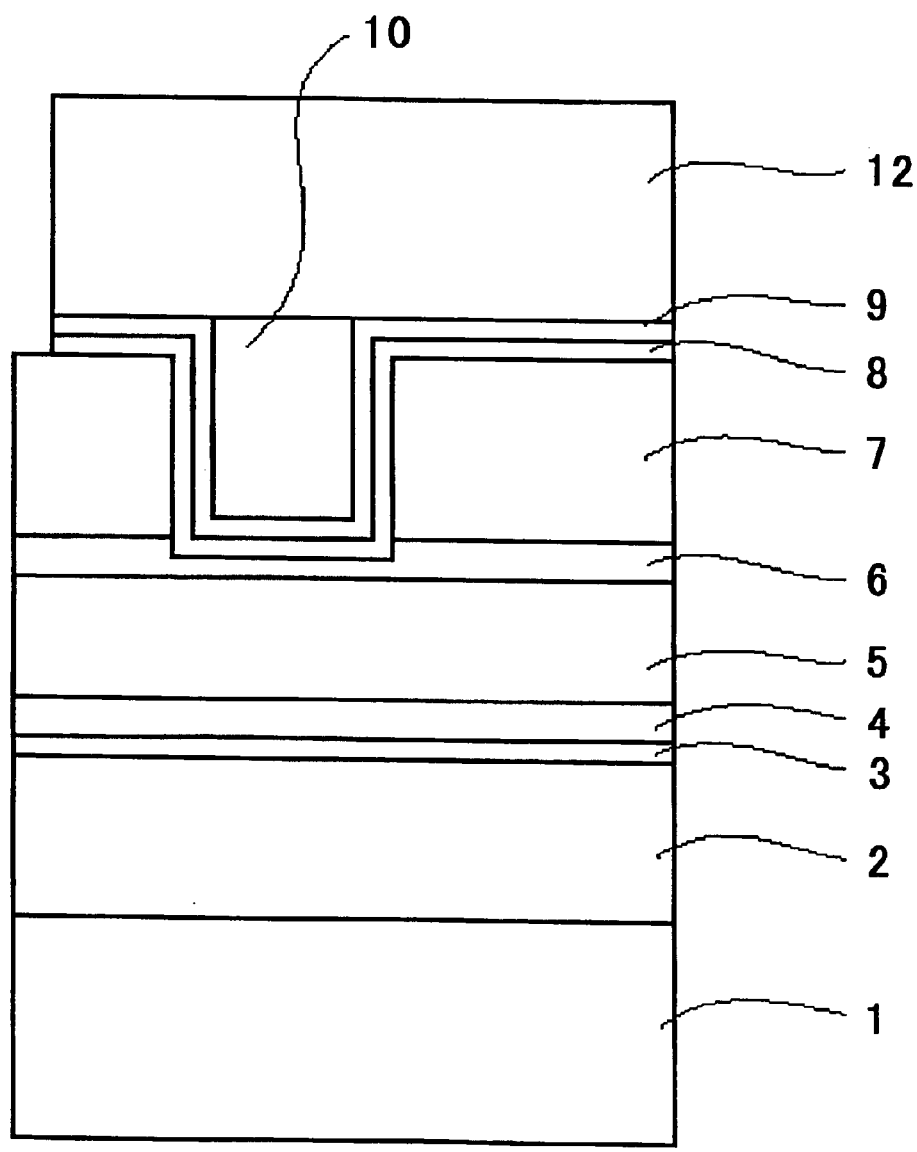
FIG. 13 is a cross-sectional view of a wiring structure A to be compared with the wiring structure in the semiconductor device in accordance with the first embodiment.
Figure 14:
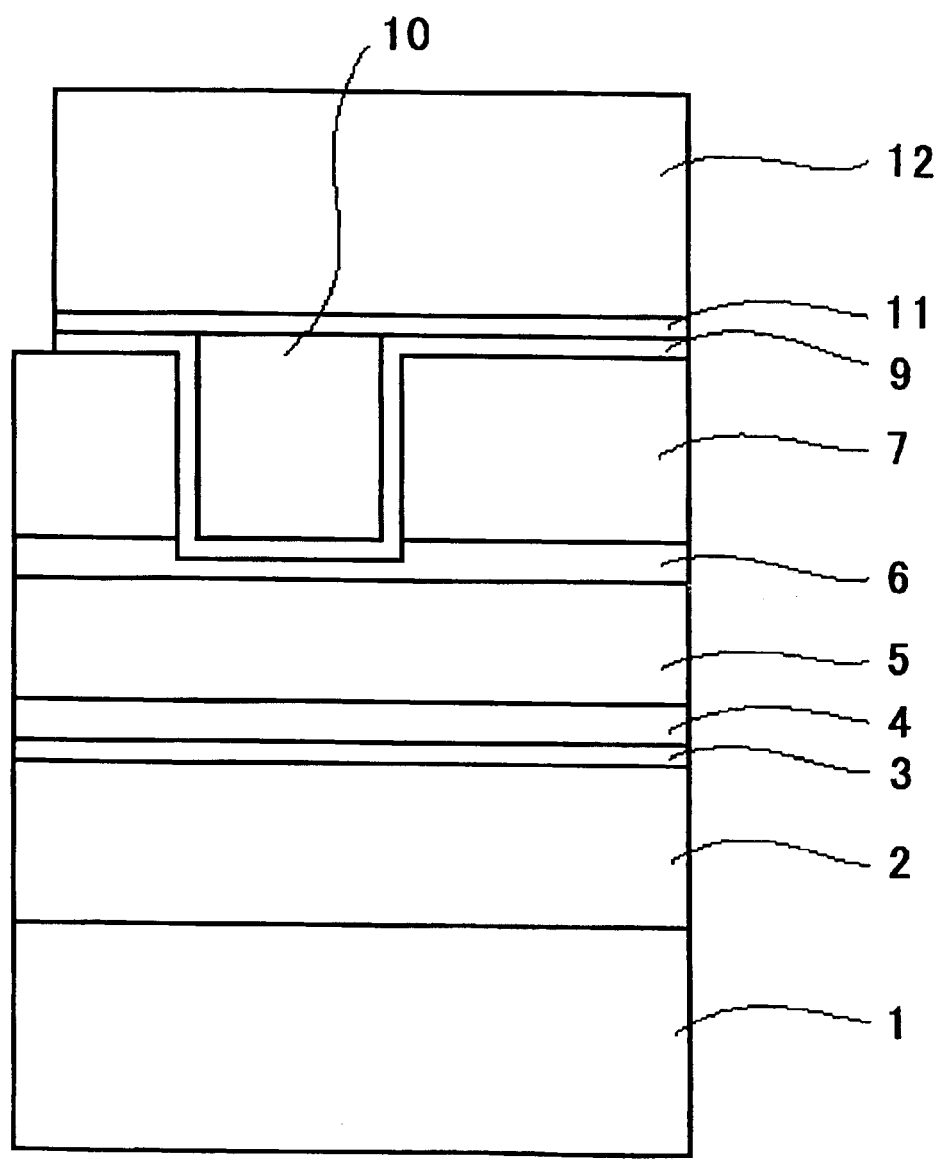
FIG. 14 is a cross-sectional view of a wiring structure B to be compared with the wiring structure in the semiconductor device in accordance with the first embodiment.

4, the wiring structure A illustrated in FIG. 13, and the wiring structure B illustrated in FIG. 14.

Figure 4:
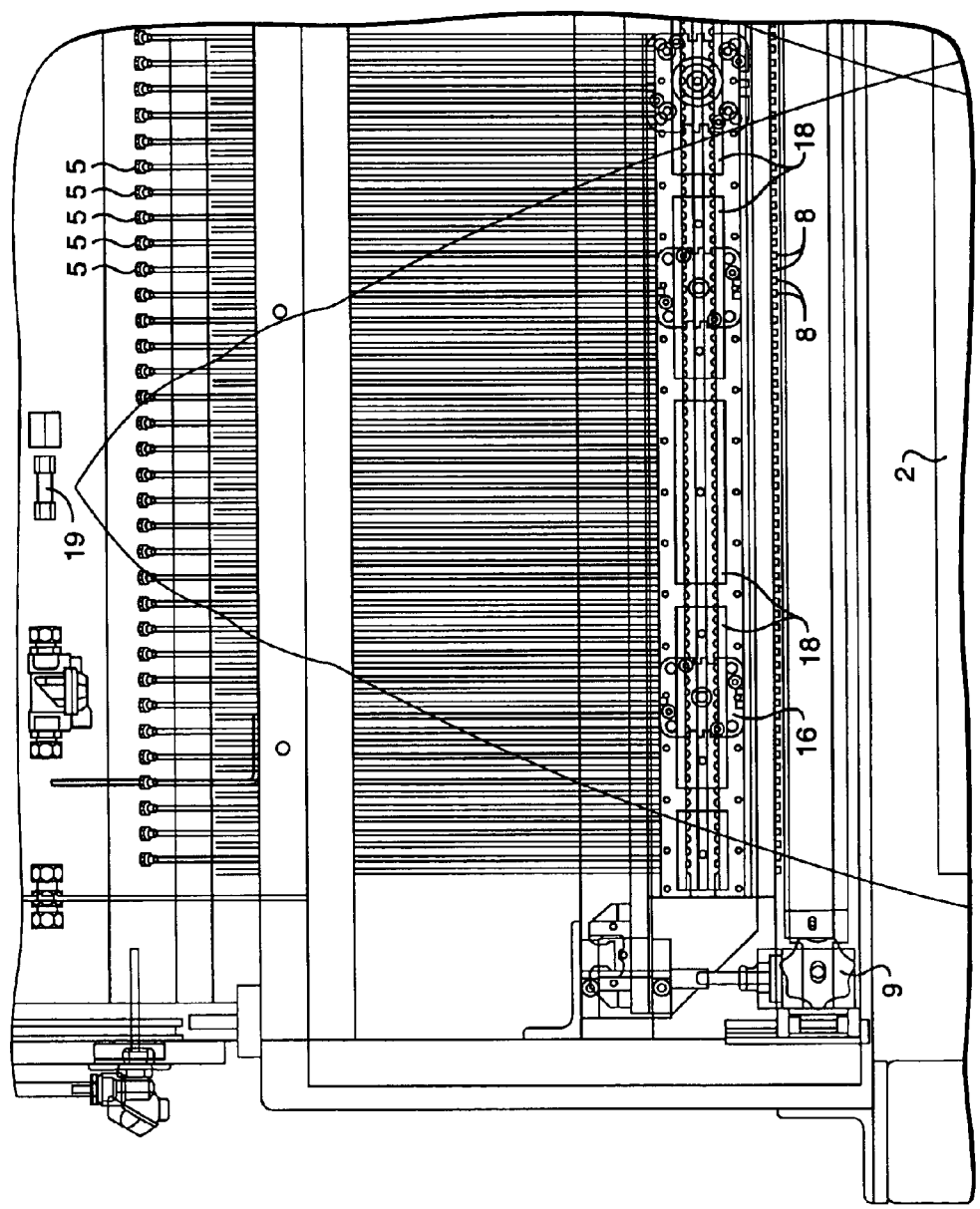
FIG. 4 is a cross-sectional view of a wiring structure in a semiconductor device in accordance with the first embodiment of the present invention.
Figure 16:
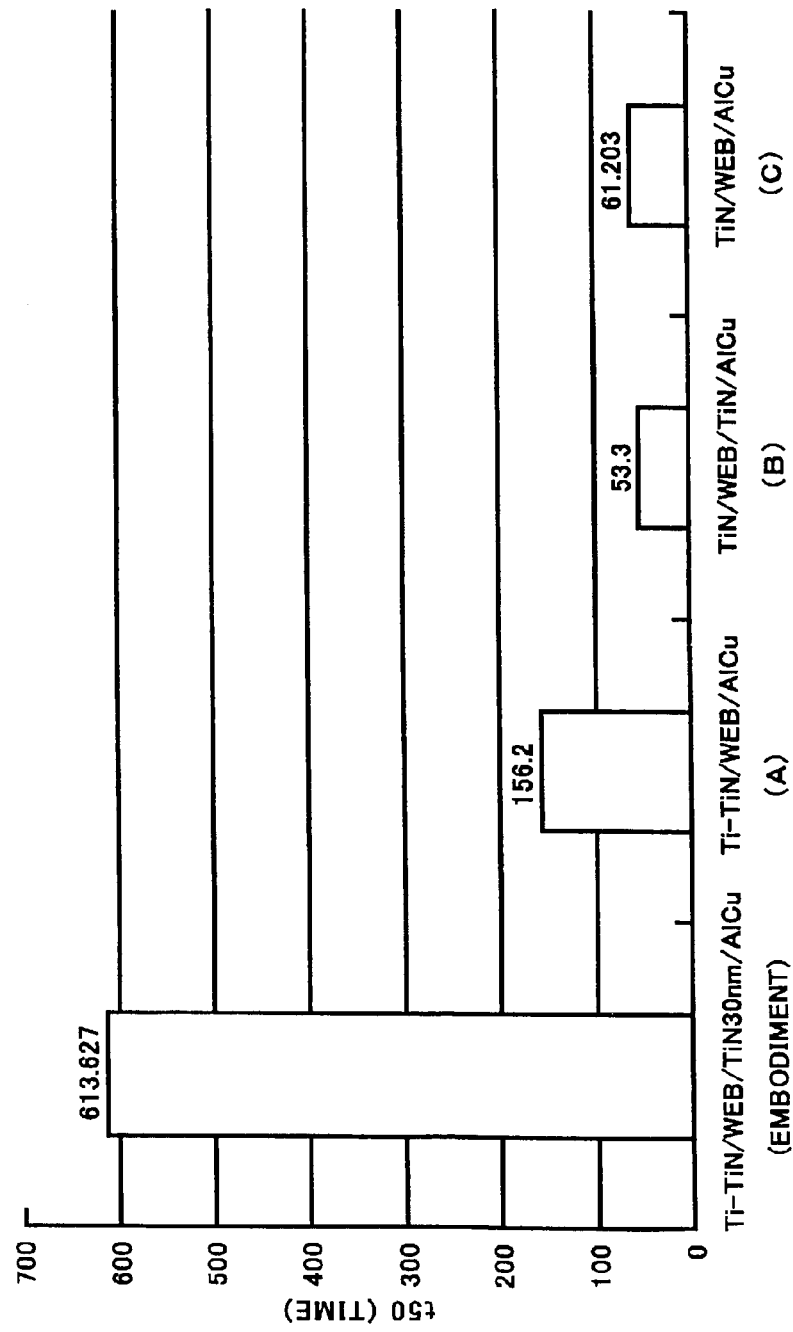

FIG. 16 is a graph showing a lifetime of the wiring structure illustrated in FIG. 4, the wiring structure A illustrated in FIG. 13, and the wiring structure B illustrated in FIG.

Figure 17:
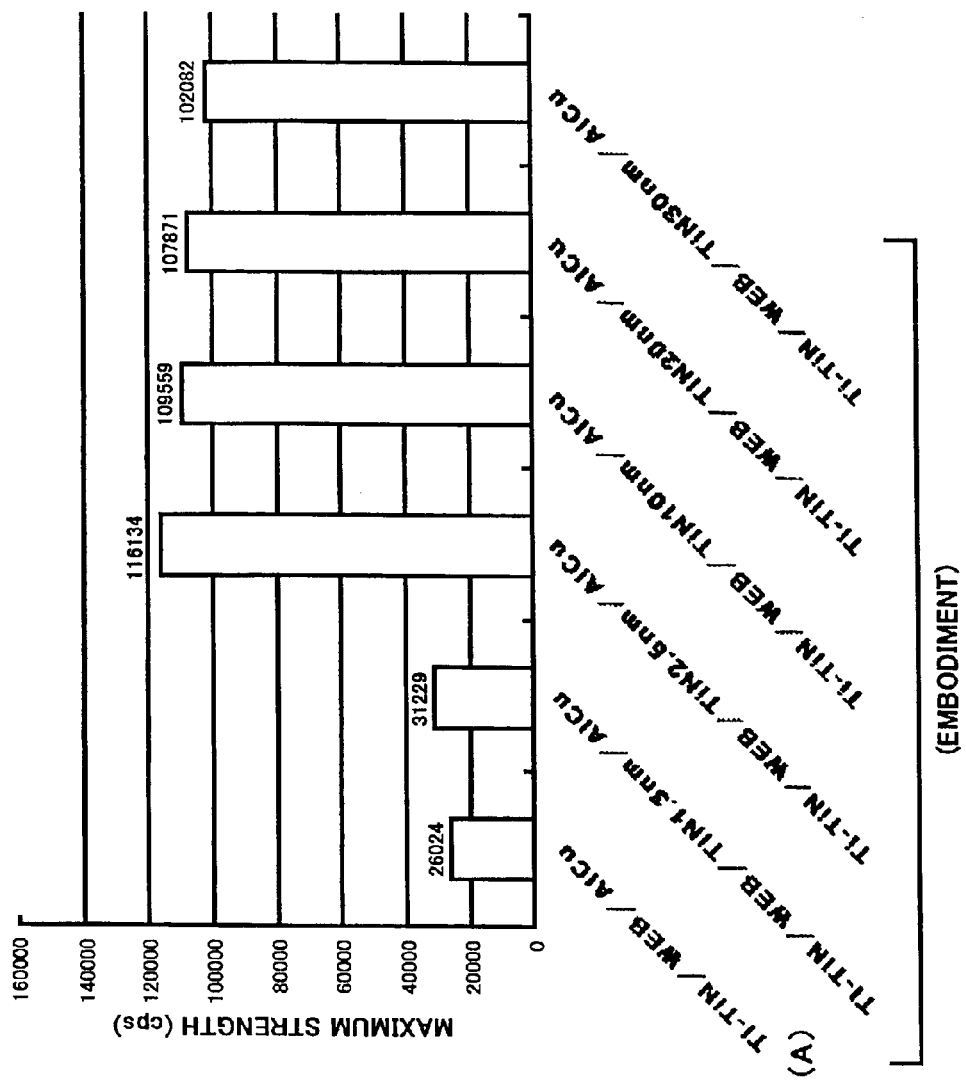

FIG. 17 is a graph showing maximum strengths in Al <111> orientation, obtained when a thickness of a titanium nitride film is varied in the wiring structure illustrated in FIG. 4.

Figure 18:
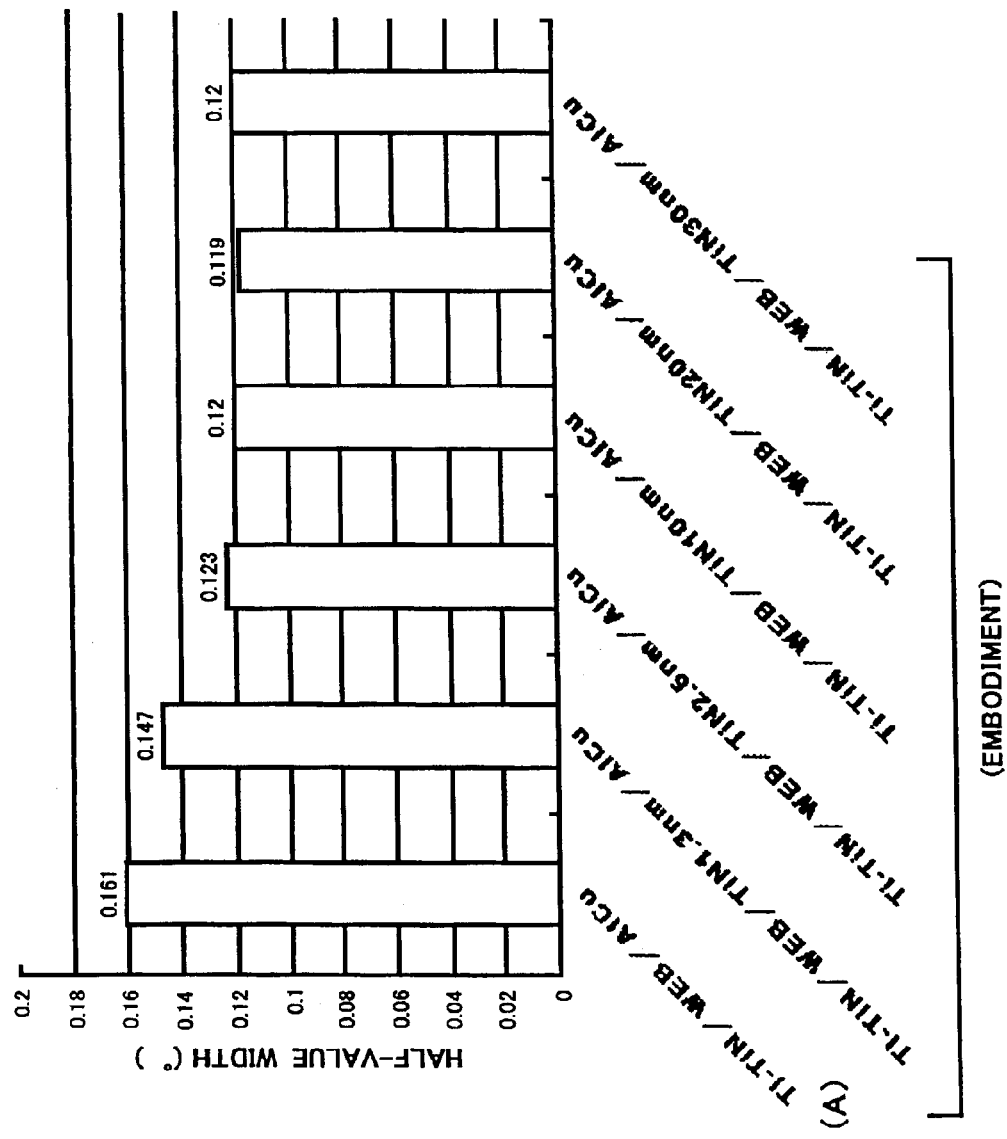

FIG. 18 is a graph showing half-value widths of aluminum obtained when a thickness of a titanium nitride film is varied in the wiring structure illustrated in FIG. 4.

DESCRIPTION OF THE PREFERRED EMBODIMENTS

Preferred embodiments in accordance with the present invention will be explained hereinbelow with reference to drawings.

FIG. 4 is a cross-sectional view of a wiring structure in a semiconductor device in accordance with the first embodiment.

The semiconductor device is comprised of a silicon substrate 1, a first electrically insulating film 2 composed of silicon dioxide and formed on the silicon substrate 1, a first titanium film 3 formed on the first electrically insulating film 2, a first titanium nitride film 4 formed on the first titanium film 3, a first aluminum-copper alloy film 5 formed as a lower wiring layer on the first titanium nitride film 4, a second titanium nitride film 6 formed on the first aluminum-copper alloy film 5, a second electrically insulating film 7 composed of silicon dioxide and formed on the second titanium nitride film 6, a second titanium film 8 covering an inner surface of a through-hole 7a formed throughout the second electrically insulating film 7, and a surface of the second electrically insulating film 7 therewith, a third titanium nitride film 9 covering the second titanium film 8 therewith, a tungsten plug 10 filled in the through-hole 7a, a fourth titanium film 11 formed covering both the tungsten plug 10 and the third titanium nitride film 9, and a second aluminum-copper alloy film 12 formed as an upper wiring layer on both the fourth titanium nitride film 11.

In the semiconductor device in accordance with the first embodiment, as a barrier metal for the second aluminum-copper alloy film 12 constituting an upper wiring layer, the second titanium film 8, the third titanium nitride film 9 and the fourth titanium nitride film 11 are formed on the second electrically insulating film 7, and the fourth titanium nitride film 11 is formed on the tungsten plug 10. This structure ensures that titanium has a peak of Ti<002> in orientation thereof, and titanium nitride has a peak of TiN <111> in orientation thereof. Being influenced by those peaks, a peak strength of <111> orientation of the second aluminum-copper alloy film 12 is made greater.

As mentioned later, the tungsten plug 10 is formed by filling the through-hole 7a with tungsten, and etching the tungsten back until the third titanium nitride film 9 appears. The third titanium nitride film 9 has a surface having been roughened by etching the tungsten back. Accordingly, if the second aluminum-copper alloy film 12 were formed directly on the thus roughened surface of the third titanium nitride film 9, there would be caused a problem that the <111> orientation of the second aluminum-copper alloy film 12 is not aligned with one another, as having been mentioned with reference to the conventional wiring structure illustrated in FIG. 1.

In order to solve the problem, in the semiconductor device in accordance with the first embodiment, there is formed the fourth titanium nitride film 11 covering the tungsten plug 10 and the third titanium nitride film 9 therewith, before the second aluminum-copper alloy film 12 is formed. The fourth titanium nitride film 11 cancels influence caused by a rough surface of the third titanium nitride film 9, and hence, solves the problem that the <111> orientation of the second aluminum-copper alloy film 12 is unlikely to be aligned.

As mentioned above, in accordance with the semiconductor device, it would be possible to omit steps of additionally forming a titanium film and a titanium nitride film, since the second titanium film 8 and the third titanium nitride film 9 are not etched back. Thus, only by carrying out a simple step of forming a titanium nitride film (specifically, the fourth titanium nitride film 11), it would be possible to obtain the second aluminum-copper alloy film 12 having enhanced <111> orientation, and thus, enhance a resistance of the second aluminum-copper alloy film 12 to electromigration.

FIGS. 5 to 12 are cross-sectional views of the wiring structure in the semiconductor device in accordance with the first embodiment. Hereinbelow is explained a process of fabricating the wiring structure illustrated in FIG. 4, with reference to FIGS. 5 to 12.

Figure 5:
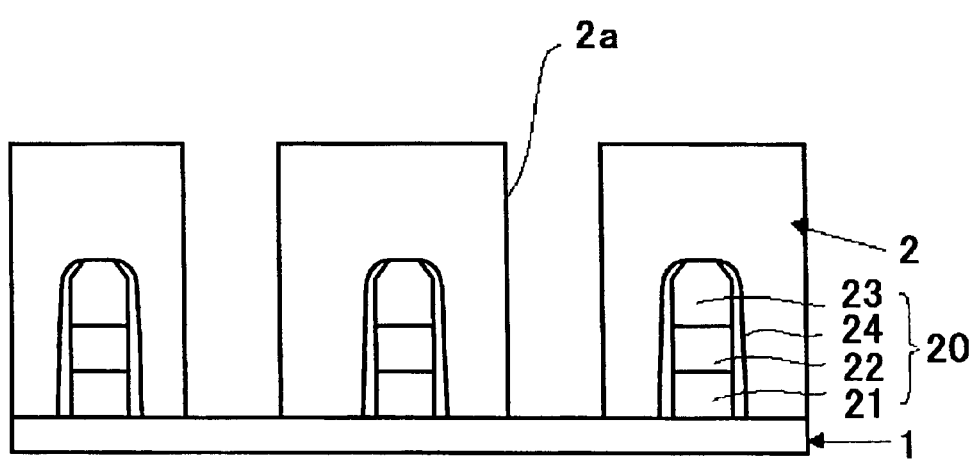
FIG. 5 is a cross-sectional view of the semiconductor device illustrated in FIG. 4, illustrating one of steps of a process of fabricating the semiconductor device.

First, as illustrated in FIG. 5, a gate electrode 20 is formed on the silicon substrate 1. The gate electrode 20 is comprised of a polysilicon layer 21 formed on the silicon substrate 1, a refractory metal silicide layer 22 formed on the polysilicon layer 21, a silicon nitride (SiN) layer 23 formed on the refractory metal silicide layer 22, and a sidewall 24 covering sidewalls of the polysilicon layer 21, the refractory metal silicide layer 22 and the silicon nitride layer 23.

The first electrically insulating film 2 composed of silicon dioxide is formed on the silicon substrate 1 so as to cover the gate electrode 20 therewith.

Then, through-holes 2a are formed throughout the first electrically insulating film 2 between the gate electrodes 20.

Figure 6:
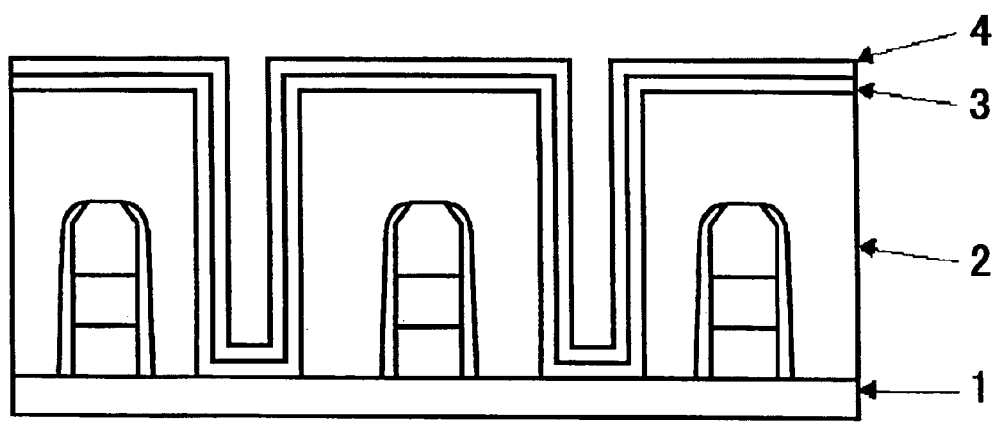
FIG. 6 is a cross-sectional view of the semiconductor device illustrated in FIG. 4, illustrating one of steps of a process of fabricating the semiconductor device.

Then, as illustrated in FIG. 6, the first titanium film 3 and the first titanium nitride film 4 are formed so as to cover inner surfaces of the through-holes 2a and a surface of the first electrically insulating film 2 therewith.

Figure 7:
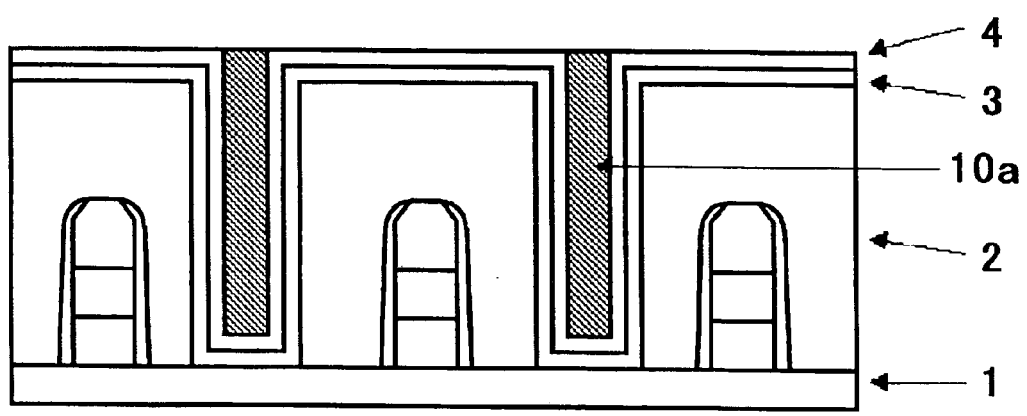
FIG. 7 is a cross-sectional view of the semiconductor device illustrated in FIG. 4, illustrating one of steps of a process of fabricating the semiconductor device.

Then, the through-holes 2a are filled with tungsten. Then, as illustrated in FIG. 7, the tungsten is etched back until the first titanium nitride film 4 appears. Thus, tungsten plugs 10a are formed in the through-holes 2a.

Figure 8:
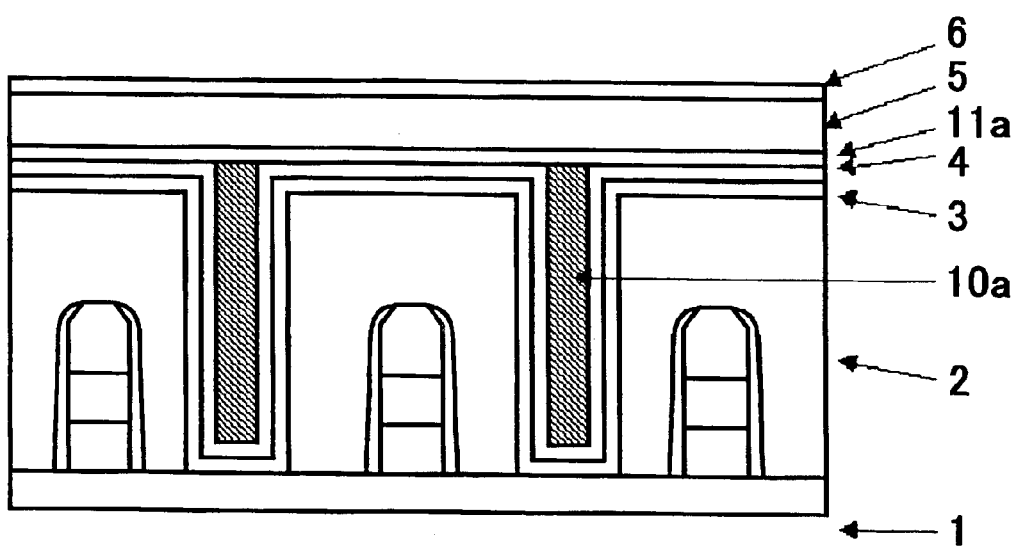
FIG. 8 is a cross-sectional view of the semiconductor device illustrated in FIG. 4, illustrating one of steps of a process of fabricating the semiconductor device.

Then, as illustrated in FIG. 8, a second titanium nitride film 11a is formed entirely over the tungsten plugs 10a and the first titanium nitride film 4. Then, the first aluminum-copper alloy film 5 is formed as a lower wiring layer on the second titanium nitride film 11a, and further, a third titanium nitride film 6 is formed on the first aluminum-copper alloy film 5.

Figure 9:
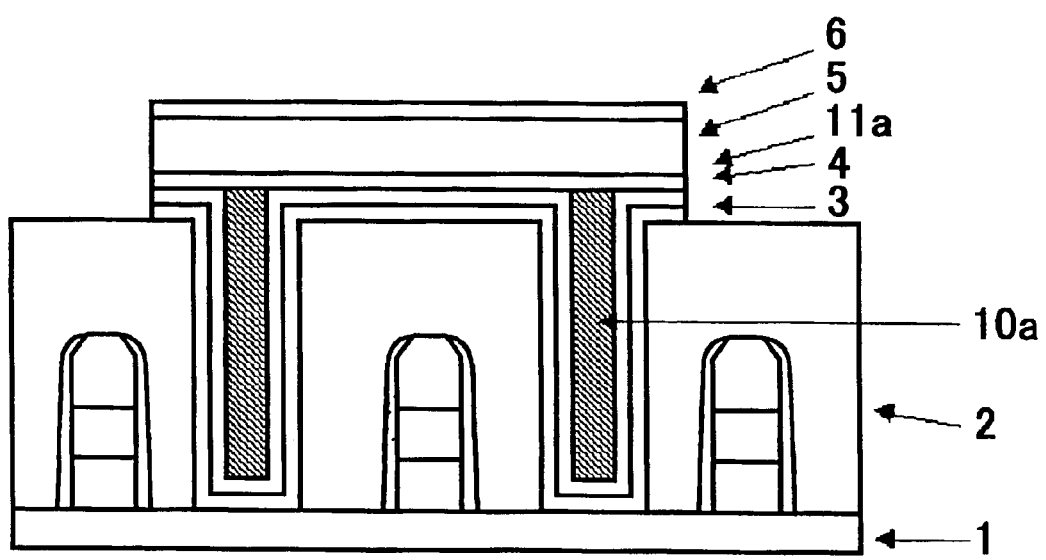
FIG. 9 is a cross-sectional view of the semiconductor device illustrated in FIG. 4, illustrating one of steps of a process of fabricating the semiconductor device.

Then, as illustrated in FIG. 9, the third titanium nitride film 6, the first aluminum-copper alloy film 5, the second titanium nitride film 11a, the first titanium nitride film 4 and the first titanium film 3 are patterned by photolithography and dry etching, for instance.

Figure 10:
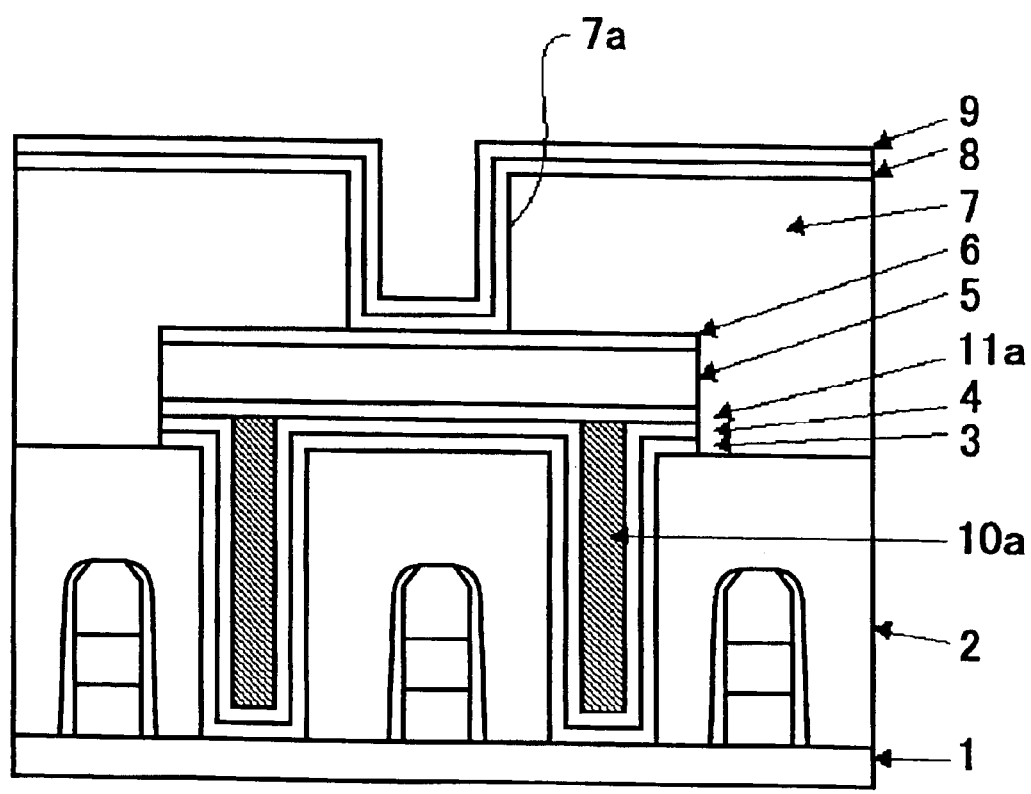
FIG. 10 is a cross-sectional view of the semiconductor device illustrated in FIG. 4, illustrating one of steps of a process of fabricating the semiconductor device.

Then, as illustrated in FIG. 10, the second electrically insulating film 7 composed of silicon dioxide is formed entirely over the third titanium nitride film 6 and the first electrically insulating film 2. Then, a through-hole 7a is formed throughout the second electrically insulating film 7 so as to reach the third titanium nitride film 6.

Then, as illustrated in FIG. 10, the second titanium film 8 and the fourth titanium nitride film 9 are formed so as to cover an inner surface of the through-hole 7a, an exposed surface of the third titanium nitride film 6 and a surface of the second electrically insulating film 7.

Then, a tungsten film is formed on the fourth titanium nitride film 9 such that the through-hole 7a is filled with tungsten. Then, the tungsten film is etched back until the fourth titanium nitride film 9 appears, to thereby form a tungsten plug 10b in the through-hole 7a, as illustrated in FIG. 11.

Figure 11:
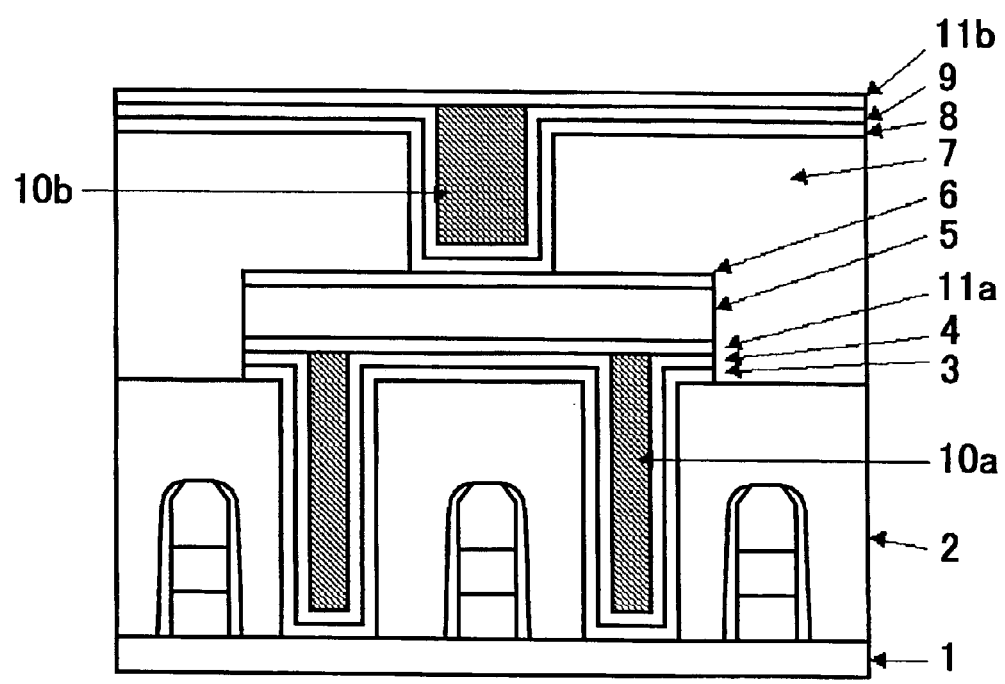
FIG. 11 is a cross-sectional view of the semiconductor device illustrated in FIG. 4, illustrating one of steps of a process of fabricating the semiconductor device.

Then, as illustrated in FIG. 11, there is formed a fifth titanium nitride film 11b covering the tungsten plug 10b and the fourth titanium nitride film 9 therewith.

Figure 12:
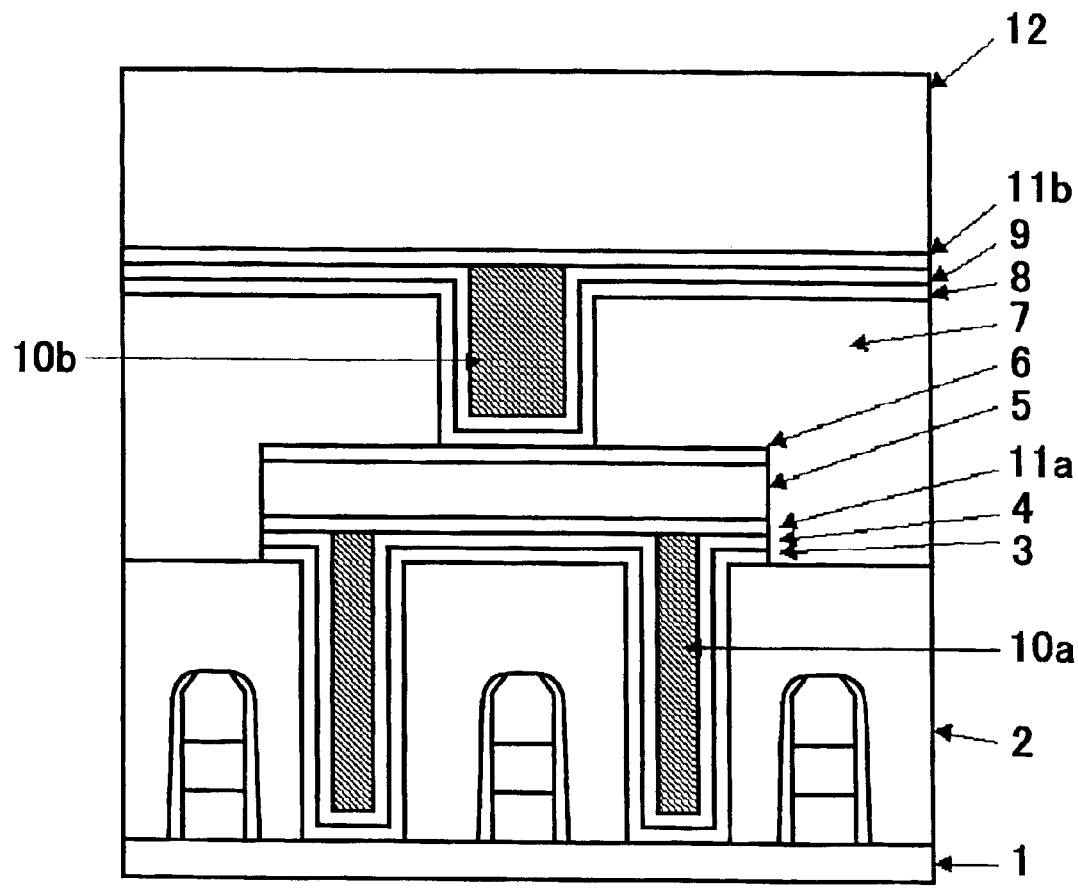
FIG. 12 is a cross-sectional view of the semiconductor device illustrated in FIG. 4, illustrating one of steps of a process of fabricating the semiconductor device.

Then, as illustrated in FIG. 12, the second aluminum-copper alloy film 12 is formed as an upper wiring layer on the fifth titanium nitride film 11b.

Hereinbelow is set forth an example of conditions for fabricating the wiring structure illustrated in FIG. 4.

The second electrically insulating film 7 composed of silicon dioxide may be formed by plasma-enhanced chemical vapor deposition (PE-CVD), for instance. The conditions for fabricating the second electrically insulating film 7 by PE-CVD are as follows.

Gases: silane ($SiH_4$) and oxygen ($O_2$)
Pressure: 1.0 to 3.0 mTorr
Power: 2.0 to 6.0 kW
Temperature: about 450 degrees centigrade The tungsten film from which the tungsten plug 10b is formed may be formed by hydrogen-reduced chemical vapor deposition, for instance. The conditions for fabricating the tungsten film by hydrogen-reduced chemical vapor deposition are as follows.

Gases: $WF_6$ and hydrogen ($H_2$)
Pressure: 1.0 to 1000 mTorr
Temperature: about 400 to about 500 degrees centigrade As mentioned earlier, the tungsten plug 10b is formed by etching the tungsten film back. Etching of the tungsten film may be carried out as ICP dry etching. The conditions for carrying out ICP dry etching are as follows.

Gases: $SF_6ArO_2$
Pressure: 10 to 700 mTorr
Power: 0.3 to 1.0 kW

The second titanium film 8, the third titanium nitride film 9, the fourth titanium nitride film 11 and the second aluminum-copper alloy film 12 may be formed by DC-magnetron type sputtering. The conditions for doing so are as follows.

Gases used for forming the second titanium film 8 and the second aluminum-copper alloy film 12: argon (Ar)
Gases used for forming the third titanium nitride film 9 and the fourth titanium nitride film 11: argon (Ar) and nitrogen ($N_2$)
Pressure: 1.0 to 10.0 mTorr
Power: 2.0 to 10.0 kW
Temperature: 100 to 350 degrees centigrade In order to estimate a maximum strength in the Al <111> orientation and a lifetime of the wiring structure in the semiconductor device in accordance with the first embodiment, the inventor fabricated the following three wiring structures A, B and C to be compared with the wiring structure in accordance with the first embodiment.

A: a wiring structure resulting from removing the fourth titanium nitride film 11 out of the wiring structure illustrated in FIG. 4

B: a wiring structure resulting from removing the second titanium film 8 out of the wiring structure illustrated in FIG. 4

Figure 1:
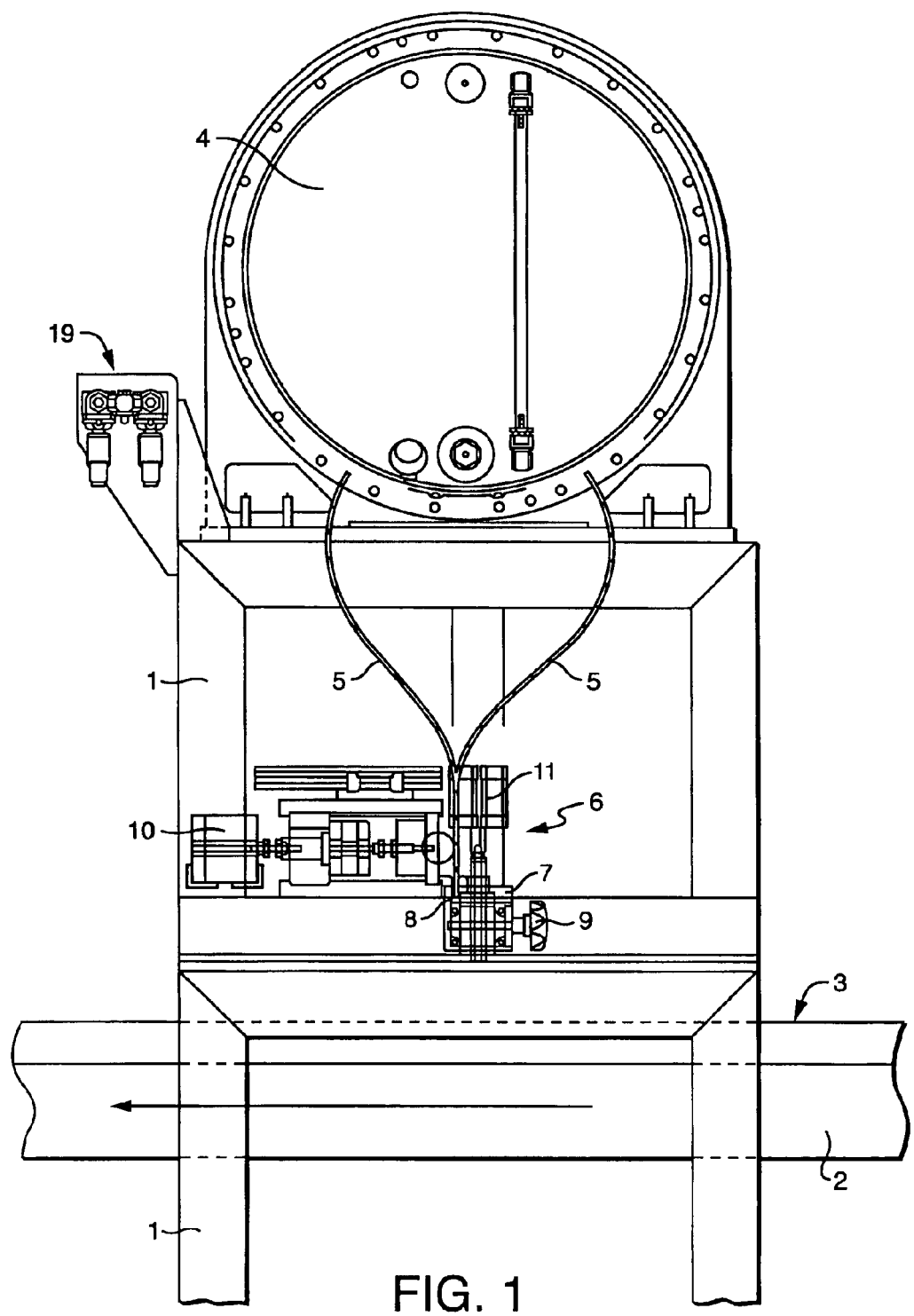
FIG. 1 is a cross-sectional view of a first example of a conventional wiring structure.
Figure 2:
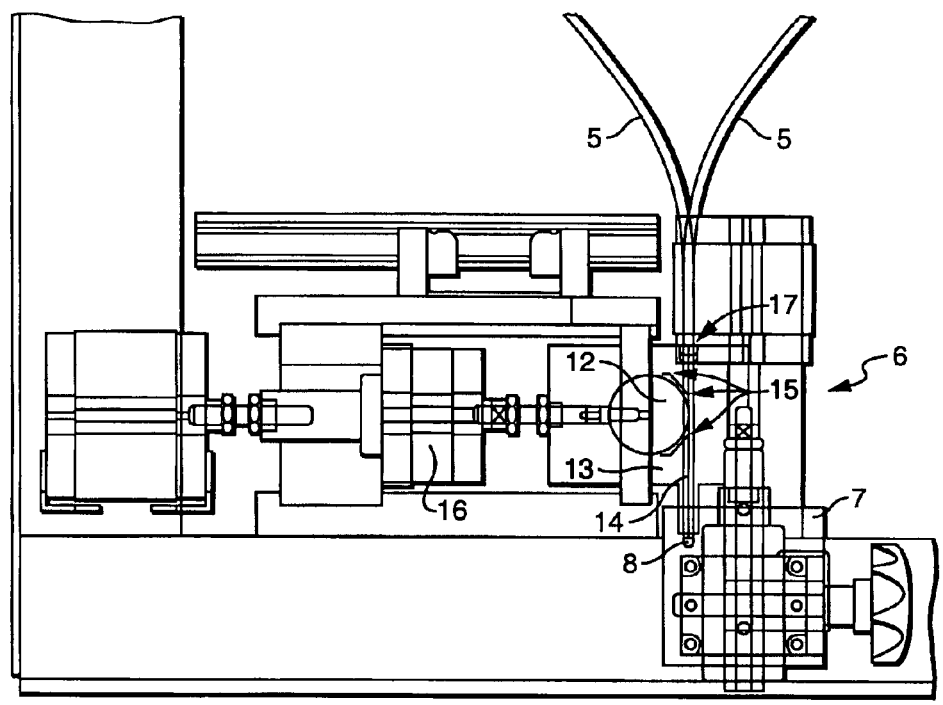
FIG. 2 is a cross-sectional view of a second example of a conventional wiring structure.
Figure 3:
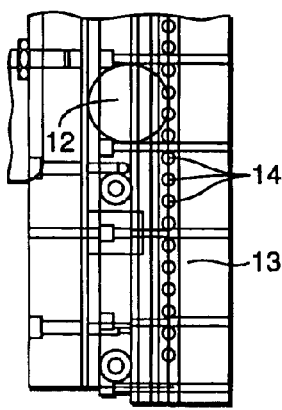
FIG. 3 is a cross-sectional view of a third example of a conventional wiring structure.

C: the wiring structure illustrated in FIG. 1 as a first example of a conventional wiring structure FIG. 13 is a cross-sectional view of the wiring structure A, FIG. 14 is a cross-sectional view of the wiring structure B, and FIG. 1 is a cross-sectional view of the wiring structure C. Parts or elements in FIGS. 13 and 14 that correspond to those of the wiring structure illustrated in FIG. 4 have been provided with the same reference numerals, and operate in the same manner as corresponding parts or elements in the wiring structure illustrated in FIG. 4, unless explicitly explained hereinbelow.

Figure 15:
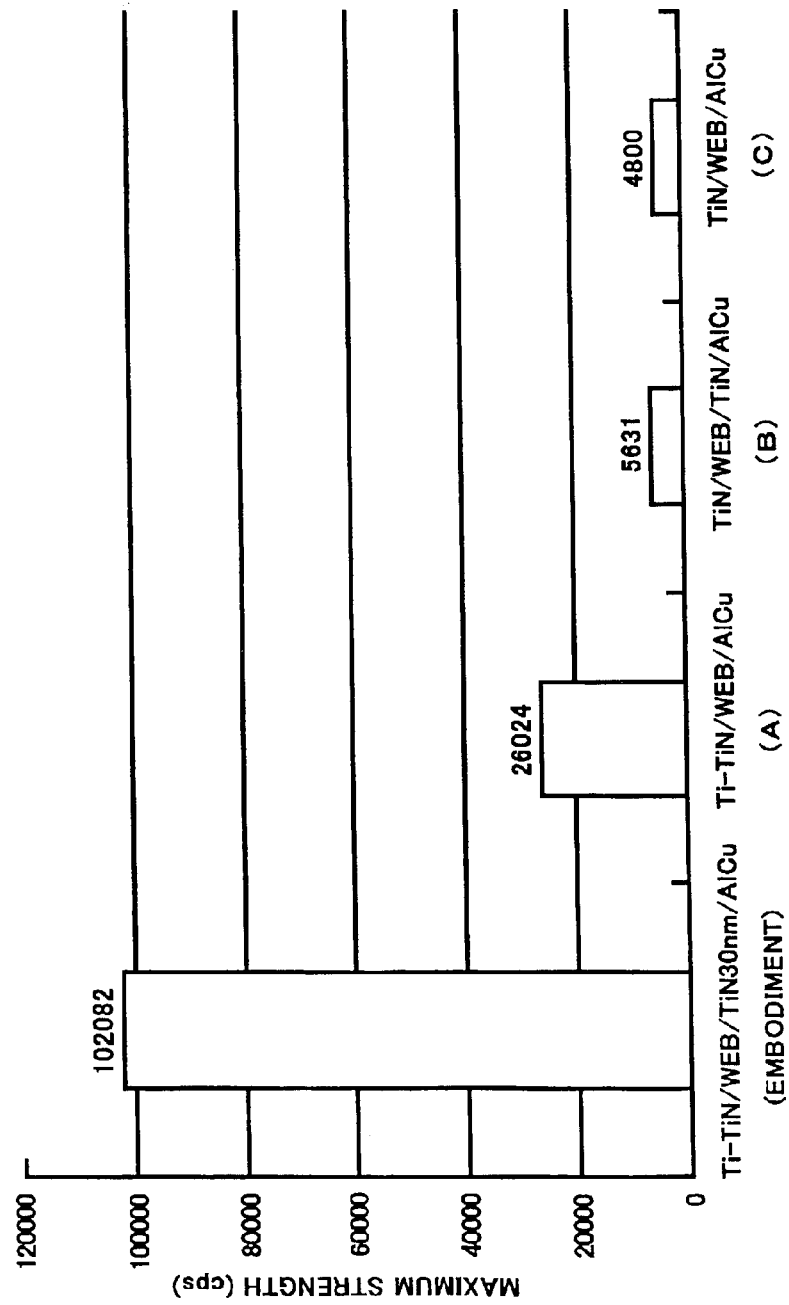
FIG. 15 is a graph showing maximum strengths in Al <111> orientation in the wiring structure illustrated in FIG.

FIG. 15 is a graph showing maximum strengths of the Al <111> orientation in the wiring structure illustrated in FIG. 4, the wiring structure A, the wiring structure B, and the wiring structure C. In FIG. 15, a maximum strength is expressed in the unit of cps (counter per second), which means the number of X-rays detected through an X-ray receiver per a second.

The fourth titanium nitride 11 in the first embodiment was set to have a thickness of 30 nm. In FIG. 15, "WEB" means that a tungsten plug is formed by wet etching back, in which case, a barrier metal formed an underlying insulating film remains non-etched.

As is understood in view of FIG. 15, the wiring structure in accordance with the first embodiment has a maximum strength significantly greater than maximum strengths of the wiring structures A, B and C.

FIG. 16 shows lifetimes of the wiring structure in accordance with the first embodiment and the wiring structures A, B and C.

In FIG. 16, "t50" is used as an indication of a lifetime of each of the wiring structures. Herein, "t50" indicates a period of time, in a test of a lifetime of a wiring structure wherein a test sample having a wiring resistance greater than a predetermined resistance is judged defective, necessary for a defectiveness rate to exceed 50%.

The fourth titanium nitride film 11 in the first embodiment was set to have a thickness of 30 nm.

As is understood in view of FIG. 16, the wiring structure in accordance with the first embodiment has a lifetime significantly longer than lifetimes of the wiring structures A, B and C.

In order to determine an appropriate thickness of the fourth titanium nitride film 11, the inventor had fabricated five semiconductors each including the fourth titanium nitride film 11 having a thickness of 1.3 nm, 2.5 nm, 10 nm, 20 nm and 30 nm, respectively, and had measured maximum strengths of the Al <111> orientation in those five semiconductor devices. The inventor had measured a maximum strength of the Al <111> orientation in the above-mentioned wiring structure A as a reference example.

FIG. 17 shows the results of the measurement of the maximum strengths of the Al <111> orientation.

In the inventor's experience, a wiring structure needs to have a maximum strength of 80,000 [cps]. As is obvious in FIG. 17, if the fourth titanium nitride film 11 has a thickness of 2.5 nm or greater, a maximum strength is over 80,000 [cps].

Accordingly, the results shown in FIG. 17 indicate that it is preferable for the fourth titanium nitride film 11 to have a thickness of 2.5 nm or greater.

FIG. 18 shows the results of measurement of a half-value width of an aluminum-copper alloy film in cases that the fourth titanium nitride film 11 has a thickness of 1.3 nm, 2.5 nm, 10 nm, 20 nm or 30 nm. FIG. 18 also shows the result of measurement of a half-value width in the wiring structure A illustrated in FIG. 13.

As illustrated in FIG. 18, a half-value width in each of the cases where the fourth titanium nitride film 11 has a thickness of 1.3 nm, 2.5 nm, 10 nm, 20 nm or 30 nm is smaller than a half-value width in the wiring structure A. In addition, if a thickness of the fourth titanium nitride film 11 is equal to or greater than 2.5 nm, a half-value width remains about 0.12 degrees.

Thus, it is understood that the semiconductor device in accordance with the first embodiment has a greater resistance to electromigration than the same of the wiring structure A illustrated in FIG. 13. Accordingly, a thickness of the fourth titanium nitride film 11 does not exert any influence on a resistance to electromigration in the wiring structure in accordance with the first embodiment.

Though the lower and upper wiring layers are composed of aluminum-copper alloy in the above-mentioned first embodiment, it should be noted that a material of which the lower and upper wiring layers are composed is not to be limited to aluminum-copper alloy. For instance, the lower and upper wiring layers may be composed of aluminum or alloy predominantly containing aluminum therein.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2002-12423 filed on Jan. 22, 2002 including specification, claims, drawings and summary is incorporated herein by reference in its entirety.

What is claimed is:

1. A semiconductor device comprising:
   (a) an upper wiring layer;
   (b) a lower wiring layer;
   (c) a plug electrically connecting said upper and lower wiring layers to each other;
   (d) a barrier metal for said plug, having a multi-layered structure comprised of a titanium film and a first titanium nitride film; and
   (e) a second titanium nitride film formed directly on both said plug and said first titanium nitride film.

2. The semiconductor device as set forth in claim 1, wherein said plug is formed by etching back a film composed of a material of which said plug is desired.

3. The semiconductor device as set forth in claim 2, wherein said material is tungsten.

4. The semiconductor device as set forth in claim 1, wherein said second titanium nitride film has a thickness equal to or greater than 2.5 nm.

5. The semiconductor device as set forth in claim 1, wherein said upper wiring layer is composed of aluminum-copper alloy.

6. A semiconductor device comprising:
   (a) an upper wiring layer;
   (b) a lower wiring layer;
   (c) an electrically insulating layer sandwiched between said upper and lower wiring layers;
   (d) a plug formed in a through-hole formed throughout said electrically insulating layer, for electrically connecting said upper and lower wiring layers to each other;
   (e) a titanium film covering an inner surface of said through-hole and a surface of said electrically insulating layer therewith;
   (f) a first titanium nitride film entirely covering said titanium film therewith; and
   (g) a second titanium nitride film directly covering said first titanium nitride film and a surface of said plug therewith.

7. The semiconductor device as set forth in claim 6, wherein said plug is formed is formed by etching back a film composed of a material of which said plug is desired.

8. The semiconductor device as set forth in claim 7, wherein said material is tungsten.

9. The semiconductor device as set forth in claim 6, wherein said second titanium nitride film has a thickness equal to or greater than 2.5 nm.

10. The semiconductor device as set forth in claim 6, wherein said upper wiring layer is composed of aluminum-copper alloy.

* * * * *